United States Patent [19]
Scholz

[11] 4,425,644
[45] Jan. 10, 1984

[54] PCM SIGNAL SYSTEM

[75] Inventor: Werner Scholz, Gehrden, Fed. Rep. of Germany

[73] Assignee: Licentia Patent-Verwaltungs-GmbH, Frankfurt, Fed. Rep. of Germany

[21] Appl. No.: 273,373

[22] Filed: Jun. 15, 1981

[30] Foreign Application Priority Data

Jun. 16, 1980 [DE] Fed. Rep. of Germany ....... 3022573

[51] Int. Cl.³ ............................................. G06F 11/10
[52] U.S. Cl. ......................................... 371/40; 371/2
[58] Field of Search ................... 371/2, 37, 38, 39, 40

[56]          References Cited
         U.S. PATENT DOCUMENTS

| | | | |
|---|---|---|---|
| 4,206,440 | 6/1980 | Doi et al. | 371/39 |
| 4,211,997 | 7/1980 | Rudnick et al. | 371/40 |
| 4,238,852 | 12/1980 | Iga et al. | 371/40 |
| 4,281,355 | 6/1981 | Wada et al. | 371/40 |
| 4,306,305 | 12/1981 | Doi et al. | 371/38 |
| 4,336,612 | 6/1982 | Inove et al. | 371/39 |
| 4,355,392 | 10/1982 | Doi et al. | 371/2 |
| 4,356,564 | 10/1982 | Doi et al. | 371/40 |

Primary Examiner—Charles E. Atkinson
Assistant Examiner—Gary V. Harkcom
Attorney, Agent, or Firm—Spencer & Frank

[57]            ABSTRACT

In a system for processing PCM signals and transmitting such signals over a channel, which system includes an input portion having a circuit for interleaving arriving data words and supplying the interleaved words to the input end of the channel, and an output portion having a circuit for de-interleaving the data words arriving at the output end of the channel so that the data words, after de-interleaving, are present in the sequence existing before interleaving, the interleaving circuit performs two successive interleaving operations on the arriving data words, and the de-interleaving circuit operates in a manner to complement the interleaving circuit.

22 Claims, 14 Drawing Figures

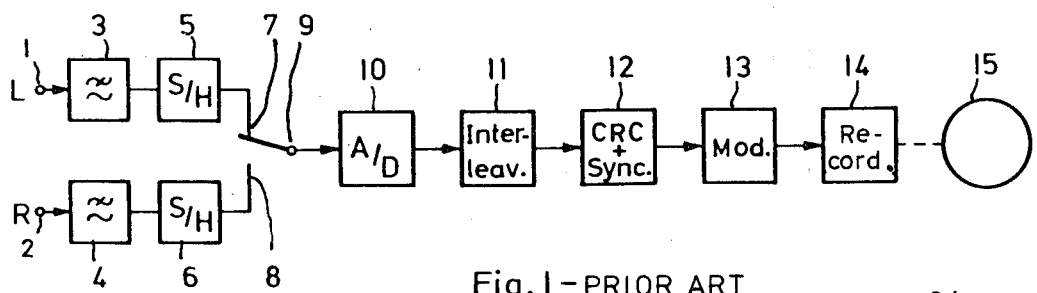
Fig. 1 — PRIOR ART
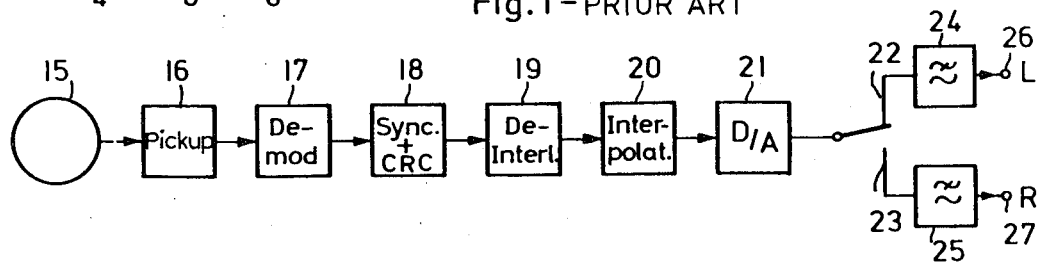
Fig. 2 — PRIOR ART
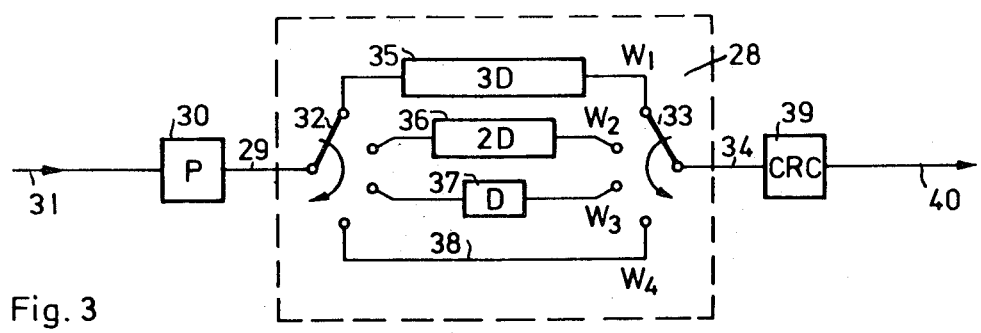
Fig. 3
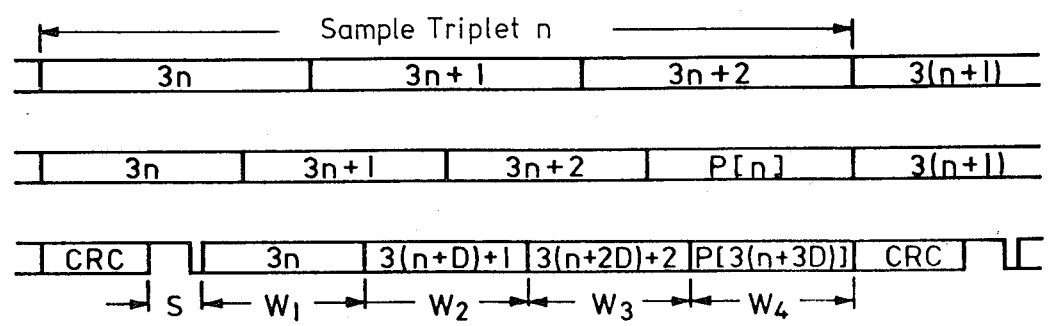
Fig. 4

PCM SIGNAL SYSTEM

BACKGROUND OF THE INVENTION

The present invention relates to a system for processing and transmitting pulse code modulation (hereinafter (PCM) signals, particularly audio signals which are recorded on a storage medium, such as a tape or disc, in PCM form and are played back therefrom.

Methods are known for recording audio or television signals as pulse codes modulated signals on a recording medium, for example a magnetic tape or a disc. Although it is possible in principle to subject data which are to be recorded or transmitted to a simple pulse code modulation and to transmit or record the coded data, this modulation method would be sufficient to meet the high demands for transmission quality only in an ideal transmission channel.

In reality, a magnetic tape, a disc or a transmission path are not ideal, but each distorts the signals to be processed and thereby adversely affects the fidelity of the resulting sound reproduction. The transmission path and the tape or disc will hereinafter be identified generally as the channel. Such a channel is a medium subject to interference, or noise, which generally distorts the signals in such a way that transmission is impossible without data security. There exist various possibilities to provide data security, which methods are sometimes used alone or together with others.

A customary method is carried out as follows: the data to be transmitted are serially divided into blocks each of the same number of data words. Each data block is supplemented by a so-called cyclic redundancy check (CRC) data word as well as synchronizing word. The CRC word is a cyclic code obtained by means of a polynomial representation. In this way it is possible to detect errors in a block terminated by a CRC data word. Such CRC data word circuits are commercially available as integrated circuits, e.g. a Fairchild 9401 circuit. To correct errors, a so-called parity word may be added to each block, so that together with the CRC data word it is possible to both detect and correct error containing data. In order to be able to effect a correction, data and parity words which belong together must be transmitted in different blocks because even a single bit error makes a complete block initially unusable.

Proposals have therefore been made to not transmit the total data on the channel in their original sequence but to delay individual data words alternatingly by a certain duration or by a multiple thereof and to transmit the delayed and the undelayed data words on the channel in succession. This is called interleaving.

Noise occurring in a recording device often produces so-called burst errors on successively transmitted data words or blocks. However, the interleaving process pulls apart, or breaks up, these burst errors so that when the data words are recombined in their final, correct, original sequence, the noise is, in effect, dispersed. The dispersed noise, or errors, can then be eliminated by parity checks or by means of an interpolation circuit. Such an interleaving method is described in a published report by the Audio Engineering Society, 64th Convention, Nov. 2-5, 1979, in New York City. Such interleaving makes it possible to essentially eliminate noise from the system output signals. However, some noise in the channel produces error events in the signal to be reproduced, which events may extend over a plurality of adjacent data words. In that case, genuine correction by parity comparison is not possible. However, at the same time the conditions for correction by means of interpolation are also particularly unfavorable since uninterfered-with supporting values are absent between the values to be replaced.

SUMMARY OF THE INVENTION

It is therefore an object of the present invention to provide a system which disperses and eliminates errors occurring in the channel better than prior art devices.

The above and other objects are achieved, according to the invention, in a system for processing PCM signals and transmitting such signals over a channel, which system includes an input portion having a circuit for interleaving arriving data words into blocks on the input end of the channel, and an output portion having a circuit for de-interleaving the data words in each block at the output end of the channel so that the data words, after de-interleaving, are present in the sequence existing before interleaving, by providing the interleaving circuit with means for performing two successive interleaving operations on the arriving data words, and the de-interleaving circuit with means operating in a manner to complement the interleaving circuit means.

The present invention provides better error coverage by interpolation than prior art circuits if a correction with the aid of the parity signal is impossible due to the occurrence of double errors spaced apart by certain error intervals. Thus, instead of a high error density, double errors which cannot be corrected by parity checks are dispersed once more so that good error removal by interpolation is made possible.

At the error locations, or moments, where interpolation can be easily performed, a genuine correction by evaluation of the parity word can also take place under the condition that the parity word is itself without an error marking. Wherever two values within one sample triplet have an error marking, no genuine correction can be made. But here, in particular, the conditions for interpolation are also particularly unfavorable in most cases. With interleaving with unequal spacings, no more than one double error can occur at any one time for two error locations X and Y. However, such a double error can neither be corrected genuinely nor is it suitable for proper interpolation. The additional interleaving according to the invention overcomes this deficiency.

The interleaving distances d for the additional interleaving can be selected to be substantially smaller than the distances D for the primary interleaving as long as the probability of direct succession of two rather long burst errors is very low. To be able to realize as effective an interleaving as possible with little additional expenditure for memories, it is advisable to design the additional interleaving in such a manner that, together with the primary interleaving, the total interleaving will be increased compared to the primary interleaving alone.

BRIEF DESCRIPTION OF THE DRAWING

FIG. 1 is a block circuit diagram of a basic PCM recording device.

FIG. 2 is a block circuit diagram of a basic PCM playback device.

FIG. 3 is a circuit diagram of a prior art interleaving device.

FIG. 4 is a signal diagram illustrating the operation of the prior art interleaving device of FIG. 3.

DESCRIPTION OF THE PREFERRED EMBODIMENTS

Figure 5:
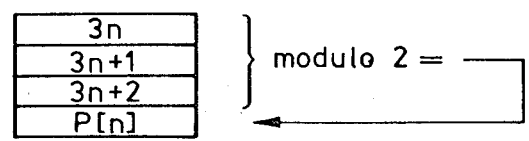
FIG. 5 is a diagram illustrating the determination of the parity word.

The recording system shown in FIG. 1 indicates, in a simplified manner, how signals from two audio channels can be processed in such a manner that they can be transmitted over a single channel. The inputs 1 and 2 constitute the low frequency inputs of the left and right audio channels, respectively. We limit our considerations here to two audio channels although it also would be possible, for example, to transmit four mutually independent, or quadraphonic, low frequency channels.

In each one of the two processing channels there is a lowpass filter 3 or 4. The lowpass filter prevents distortion of the signal by the sampling process. The filters 3 and 4 are followed by the sample-and-hold circuits 5 and 6 which, along with all subsequent circuits, are controlled by a common clock pulse generator which is not shown. The outputs of the sample-and-hold circuits 5 and 6, which are operated in push-pull, are connected to the two terminals 7 and 8 of a switch 9 which always transmits the sample which is being held while sampling is taking place in the other channel.

With this switch 9 it is made possible that the respective samples of the left an right channels are fed serially in sequence alternatingly to the subsequent analog/digital converter 10 whose output is in turn connected to the interleaving circuit 11 in which the data words arriving in the proper sequence are interleaved in a selected manner. The interleaved data words are combined into groups of, e.g., three pairs of samples. In a further circuit 12, a CRC word and synchronization bits are added to each group. This digital signal which is coded in blocks is fed to a modulator 13 from which the modulated signal is transferred to the transmission channel, which here includes, for example, a recording device 14, a record carrier 15 and a pickup device 16. The record carrier 15 may be a magnetic tape or a disc. However, the transmission channel 14, 15, 16 may also be formed by a cable or radio link.

FIG. 2 shows a playback device for processing a PCM signal picked up from the record carrier 15. The signal obtained from the pickup device 16 is fed to a demodulator 17. From the demodulator 17, the PCM signal reaches a circuit 18 in which the synchronization and CRC words are evaluated. If the CRC evaluation indicates the presence of an error, all data words of the block in question are provided with an error marking. Then follows the de-interleaving circuit 19 which de-interleaves the data words that were interleaved at the recording end. Data words provided with error markings are subsequently replaced in the interpolation circuit 20 by the average of the adjacent data words. The resulting corrected PCM data signal whose words are present serially in the correct sequence is fed to the digital/analog converter 21 from which it is fed alternatively to the two low frequency channels 22 and 23 equipped with lowpass filters 24 and 25, respectively. At the terminals 26 and 27, the audio frequency signal can then be obtained for further processing. The interpolation could also take place in the analog region, i.e. subsequent to the digital/analog converter.

Figure 6:
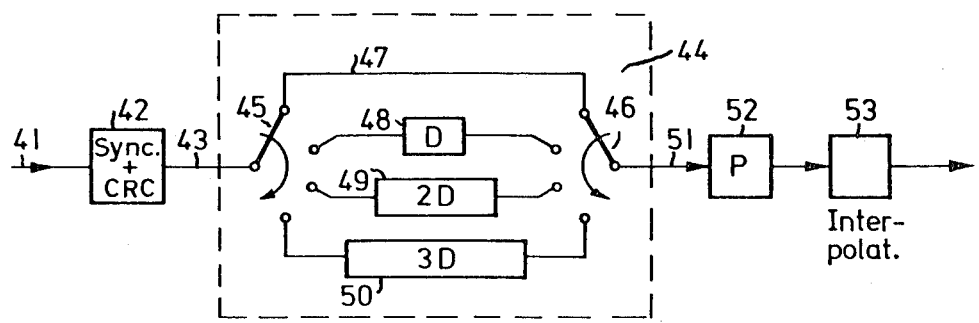
FIG. 6 is a circuit diagram of a prior art de-interleaving device compatible with the interleaving device of FIG. 3.

In order to be able to make a genuine correction of samples, falsified, or distorted by noise, it is necessary to transmit, for example, an additional parity signal. In order to produce such a parity signal, an additional circuit component in the form of a parity circuit 30, represented in FIG. 3, is inserted in the recording circuit of FIG. 1 between the analog/digital converter 10 and the interleaving circuit 11. An additional circuit component 52 in the form of an evaluator represented in FIG. 6, is disposed in the receiver circuit of FIG. 2 between the de-interleaving circuit 19 and the interpolator 20 to evaluate the parity signal.

FIG. 3 shows a prior interleaving device which includes an interleaving circuit 28 connected to the output 29 of the parity circuit 30. The signal coming from the analog/digital converter 10 to the input 31 of the parity circuit 30 is supplemented in that one parity word is added to each PCM signal block and is also processed, in addition to the signal words, in the interleaving circuit 28. The interleaving circuit 28 includes two switches 32 and 33 which synchronously connect the input 29 and the output 34 to paths 35, 36, 37 and 38 in succession. Path 35 here includes a device for delaying the incoming signal by a duration 3D. That is the duration of 3D successive data blocks of, e.g. D=16 data blocks. The path 36 has a delay of the duration 2D, the path 37 has a delay of the duration D and the path 38 has no delay. A circuit 39 which attaches a cyclic redundancy check (CRC) word and synchronizing bits to the interleaved data words is connected to the output 34 of the interleaving circuit 28. From circuit 39, the signal travels through line 40 to the modulator 13 of FIG. 1.

FIG. 4 shows how the signal reaching the modulator 13 is formed. The signal present at the input 31 of the parity circuit 30 is shown on the first line of FIG. 4. The sample triplet numbered n, where n is 0 or a positive integer, includes the sample pairs 3n, 3n+1 and 3n+2. As shown in the second line of FIG. 4, the associated parity word P[n] is attached to each sample triplet n in the parity circuit 30. Each left-right sample pair of a sample triplet n is composed of a word of 28 bits, 14 bits being derived by the analog/digital converter from each sample of each audio frequency input channel. The third line of FIG. 4 shows the signal present at the input 40 of the modulator circuit 13. The individual data words have been interleaved by the interleaving circuit 28 in such a manner that all sample words, except those numbered 3n, have been delayed to a greater or lesser extent. The parity word P[n] has been delayed, for example, by 3D. In the circuit 39, corresponding to circuit 12 of FIG. 1, a CRC word and synchronization bits S are attached to the four sample words $W_1$ through $W_4$.

FIG. 5 shows the formation of the parity word P[n] for a sample triplet with the block number n. This parity word is produced bit by bit by modulo-2 addition of corresponding bits of the individual sample words. The parity words is treated in the same manner as the sample words and is therefore also subjected to a delay in the interleaving circuit 28.

FIG. 6 shows a de-interleaving device designed to cooperate with the circuit of FIG. 3 by producing delays in the reverse order. From the output 41 of demodulator 17 of FIG. 1, the signal travels through a CRC circuit 42, corresponding to circuit 18 of FIG. 1, in which a determination is made whether the respective block has been transmitted correctly. If the CRC evaluation determines the presence of an error, all data words of the respective data block are provided with an error marking. From the output 43 of the circuit 42 of the data block, freed of synchronization bits and CRC words, reaches the de-interleaving circuit 44 in which the signal is fed via the synchronously operating switches 45 and 46 over the paths 47 through 50 in cyclic succession. Path 47 here has no delay, path 48 has a delay by the duration D, path 49 a delay by the duration 2D and path 50 a delay by the duration 3D. From the output 51 of the de-interleaving circuit 44 the signal reaches the parity check circuit 52 in which the parity word is evaluated and error containing words are corrected. From the parity check circuit 52 the signal reaches an interpolation circuit 53 in which error locations which could not be corrected by parity check because a plurality of error markings appear within one sample block are linked with preceding and subsequent data words in such a manner that approximately the correct data word is reached, as will be explained with reference to FIG. 12.

Figure 7:
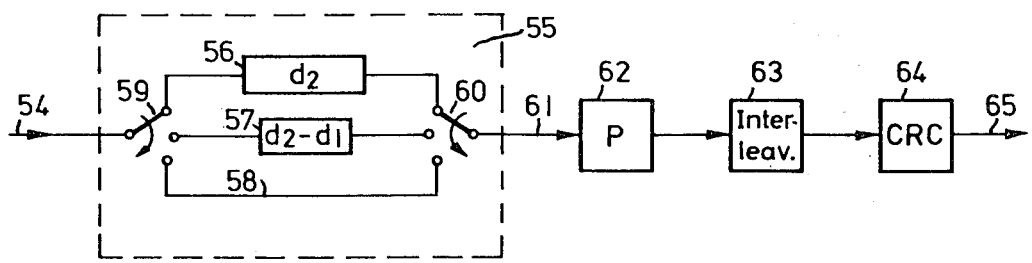
FIG. 7 is a circuit diagram of one preferred embodiment of a multiple interleaving device according to the invention.

FIG. 7 shows one preferred embodiment of a multiple interleaving device according to the invention. Here the signal coming from the analog/digital converter 10 of FIG. 1 reaches the input 54 of a first interleaving circuit 55 in which the successive incoming data words, or sample pairs, are alternatively fed through respective ones of the delay paths 56, 57 and 58. The differences between the delays produced by paths 56 and 57 and between those produced by paths 57 and 58 may initially be arbitrary. The switches 59 and 60 switch the input 54 and the output 61 in synchronism to the delay path 56 having a delay duration $d_2$, the delay path 57 having a delay duration $d_2 - d_1$ and the path 58 producing no delay. From the output 61 of the interleaving circuit 55, the interleaved data words are fed to the parity circuit 62 where a parity word is formed by the above-described modulo-2 addition of a plurality of successive data words which have been interleaved in the interleaving circuit 55.

The output signal of the parity circuit 62 now reaches a further interleaving circuit 63 which again interleaves the incoming data words with the same or different interleaving delays as circuit 55. To the multiply interleaved data words synchronization bits and a CRC word are attached in the subsequent circuit 64. This signal then travels through line 65 to the modulator 13 of FIG. 1.

Figure 8:
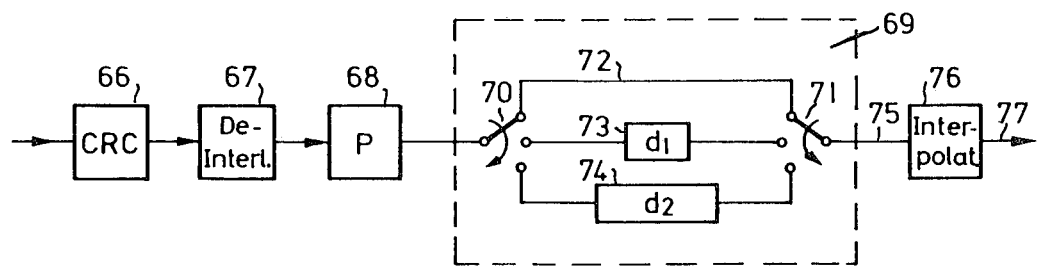
FIG. 8 is a circuit diagram of a preferred embodiment of a multiple de-interleaving device according to the invention, which is compatible with the interleaving device of FIG. 7.

The associated circuit on the playback side is shown in FIG. 8 and is the complement to the circuit of FIG. 7. In the circuit of FIG. 8, the signals coming from the transmission channel 14–16 can be processed so that they can be fed to the low frequency output channels 22 and 23. From the transmission channel, the signals travel to a CRC circuit 66 in which the CRC words are checked. If an error is noted, all data words belonging to the associated block are identified by an error signal. The CRC circuit 66 is followed by a first de-interleaving circuit 67 which de-interleaves the incoming signal in a manner complementary to the interleaving performed in the further circuit 63 of FIG. 7. From the de-interleaving circuit 67 the once de-interleaved data words reach a parity circuit 68 in which the parity word is separated from the remaining data and is evaluated.

The parity corrected signal then reaches a further de-interleaving circuit 69 including switches 70 and 71 with which successive words of the incoming signal are fed to successive ones of the paths 72, 73 and 74 having respectively different delay durations. In path 72 the signal is not delayed, in path 73 it is delayed by $d_1$ and in path 74 it is delayed by $d_2$. Circuit 69 thus operates in a manner complementary to first interleaving circuit 55. At the output 75, the signal again appears in its original sequence. Error marked samples which could not be corrected in the parity circuit 68, because several marked values were present within one data block, retain their error markings. In the subsequent interpolation circuit 76 all data words still marked with an error marking are replaced by a substitute signal. From the output 77 of interpolation circuit 76, the corrected signal reaches the digital/analog converter, corresponding to circuit 21 of FIG. 1. The interpolation may also take place in the analog region.

Figure 9:
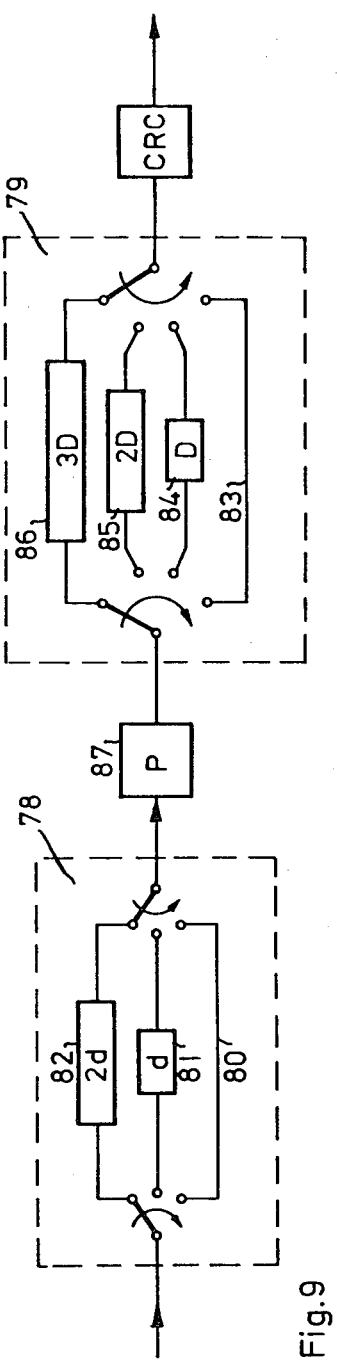
FIG. 9 is a circuit diagram of another embodiment of an interleaving device according to the invention producing equal interleaving spacings.

FIG. 9 shows a specific embodiment of a recording device according to the invention which includes two interleaving circuits 78 and 79 each operating with delay paths having equal delay differences between adjacent paths. Paths 80 and 82 differ from one another by the duration d, while paths 83 through 86 differ from one another by the duration D. The parity circuit 87 is disposed between the two interleaving circuits 78 and 79.

Figure 10:
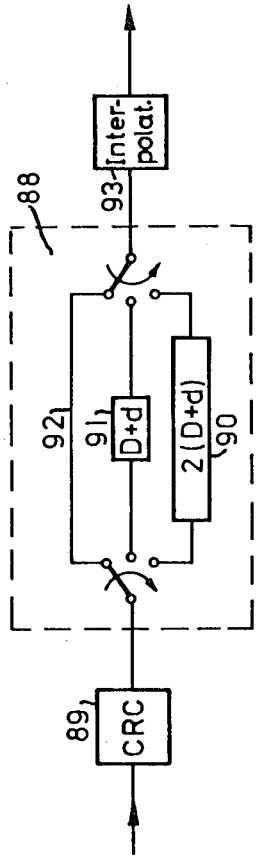
FIG. 10 is a circuit diagram of another embodiment of a de-interleaving device according to the invention compatible with the device of FIG. 9 but without parity check for the signal.

FIG. 10 shows one embodiment of a de-interleaving circuit 88 which can be used at the playback end in cooperation with the recording circuit of FIG. 9. The signal coming from the CRC circuit 89 reaches alternate ones of the paths 90, 91 and 92 in the de-interleaving circuit 88. Path 90 here produces a delay of 2 (D+d), path 91 produces a delay D+d and path 92 produces no delay. The arrangement of FIG. 10 is complementary to the arrangement of FIG. 9 with the difference that the de-interleaving circuit 88 de-interleaves the combined delays of the circuits 78 and 79 in such a manner that the signal again appears in its original sequence at the output 93 of the de-interleaving circuit 88. The de-interleaving circuit 88 does not allow for evaluation of the parity word which had been attached to the data in circuit 87. Therefore, the interleaving circuit 88 does not require a delay path having a delay duration 3D. The total delay of the entire signal from the input to the circuit 78 to the output of circuit 88 is therefore 2 (D+d) for all data words. It has been found that an evaluation of the parity word in an electronic playback device for home use can be omitted, unless true digital correction is desired, for example during re-recording. The parity word attached to the data at the recording end is therefore always separated in this playback device from the data at the playback end and is not evaluated.

Figure 11:
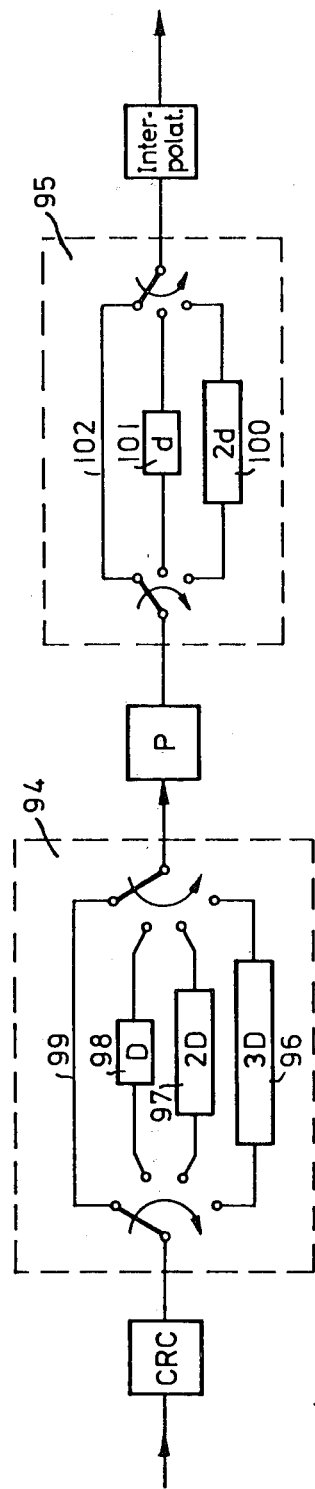
FIG. 11 is a circuit diagram of another embodiment of a de-interleaving device according to the invention compatible with the device of FIG. 9 and producing a parity check.

If very high demands are made for playback quality, or fidelity, the parity word can be evaluated in the playback circuit shown in FIG. 11, but this requires, contrary to FIG. 10, two de-interleaving circuits 94 and 95 between which the parity words are evaluated. The de-interleaving circuit 94 here includes, as a complement to the interleaving circuit 79, the delay paths 96 through 99 producing delays complementary to those of circuit 79. The difference between the delays in adjacent paths is D. In the second de-interleaving arrangement 95 at the playback end, the incoming signals are switched successively between the paths 100, 101 and 102. Between the delay paths 100 and 101 as well as between 101 and 102 the delay difference is d. The total delay of all data between the input to circuit 78 at the recording end and the output of circuit 95 at the playback end is likewise 2(D+d) as in FIG. 10. A delay 3D is applied only to the parity word and does not appear in the delay of the signal words.

Figure 12:
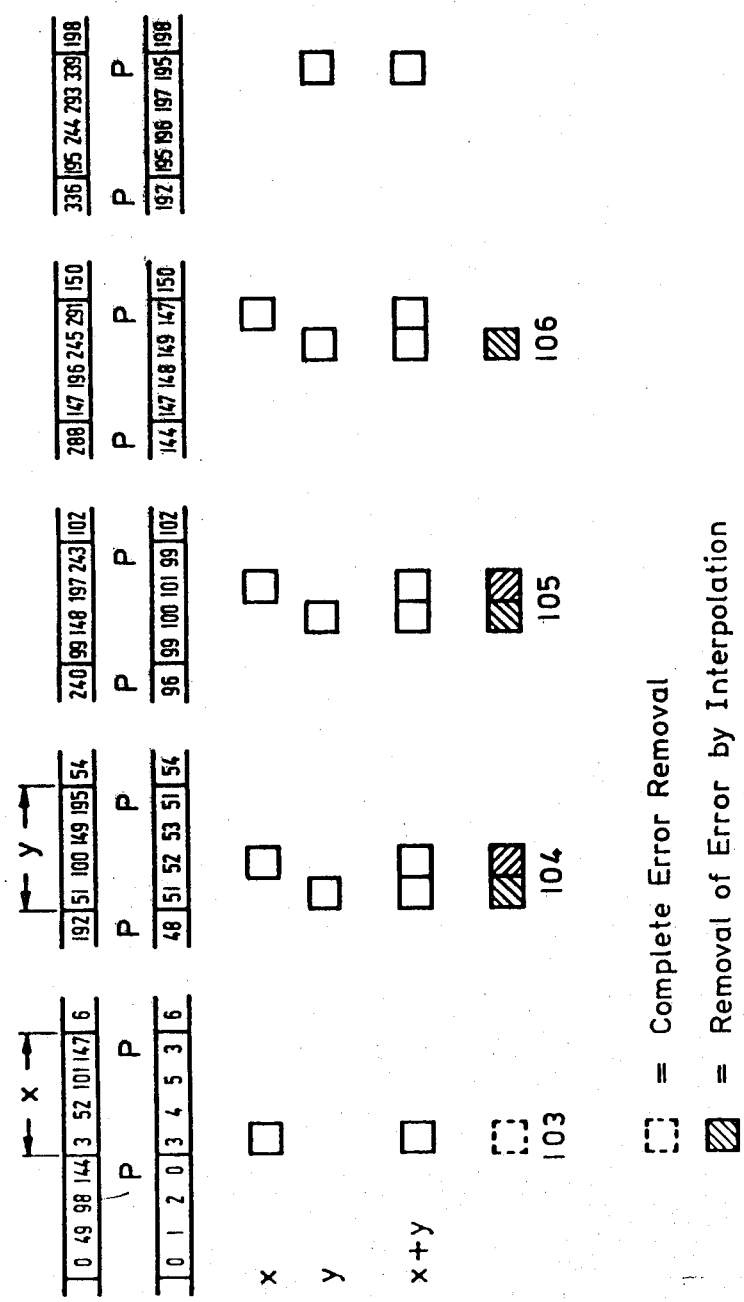
FIG. 12 is a diagram illustrating the effect of errors in a prior art system employing the devices of FIGS. 3 through 6 with identical interleaving spacings.

FIG. 12 shows the effect of errors in a prior device according to FIGS. 3 to 6 employing identical differences between successive interleaving delays. The first line of FIG. 12 shows a data pattern as it is present at the input 43 of the de-interleaving circuit 44 of FIG. 6, while the second line shows the resulting pattern at the output 51 of circuit 44. Two error locations x and y appear in the input data pattern and are distributed in the output pattern shown in the second line of FIG. 12, after coming out of the de-interleaving circuit 44, according to the patterns shown in the third and fourth lines of FIG. 12. If both error locations x and y influence a single output block, the data pattern coming out of the de-interleaving circuit includes error words located as shown in the fifth line of FIG. 12. The 6th line shows how, in this prior device, the error locations can be eliminated. The error location 103 can be completely removed by evaluation of the parity word, since in the comparison block including the sample words 3, 4, 5 and the parity word P3 there occurs only one error marking. However, the error locations 104, 105 and 106 must be removed by interpolation since here two error markings are present in each comparison block. This is more difficult for the error locations 104 and 105 because these are double error locations between which no error-free supporting value is present.

Figure 13:
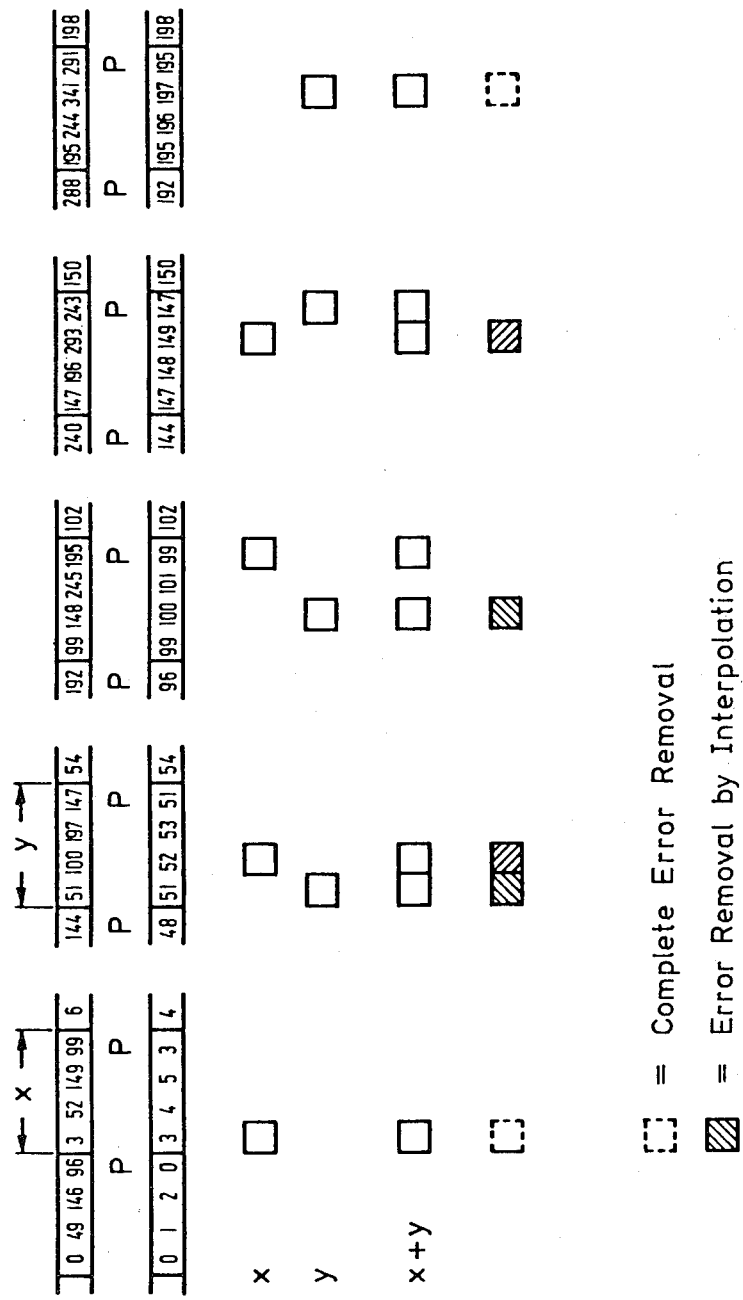
FIG. 13 is a diagram similar to that of FIG. 12 illustrating the effect of errors in a device having unequal interleaving spacings.

FIG. 13 is a diagram similar to that of FIG. 12 showing the treatment of errors in a system in which the time delays between successive data words at the interleaved output are unequal. The first line of FIG. 13 shows a data pattern corresponding to that at the first line of FIG. 12. It can be seen that error removal in interleaving circuits with unequal interleaving delay differences has the advantage that with a certain error distribution as shown in the sixth line of FIG. 13, the number of double error locations is reduced compared to the sixth line of FIG. 12 so that interpolation is facilitated. But here again a double error will still appear wherever correction by parity check is impossible and such error is also particularly ill suited for correction by interpolation since between the two interfered-with words there is no uninterfered-with supporting value.

Figure 14:
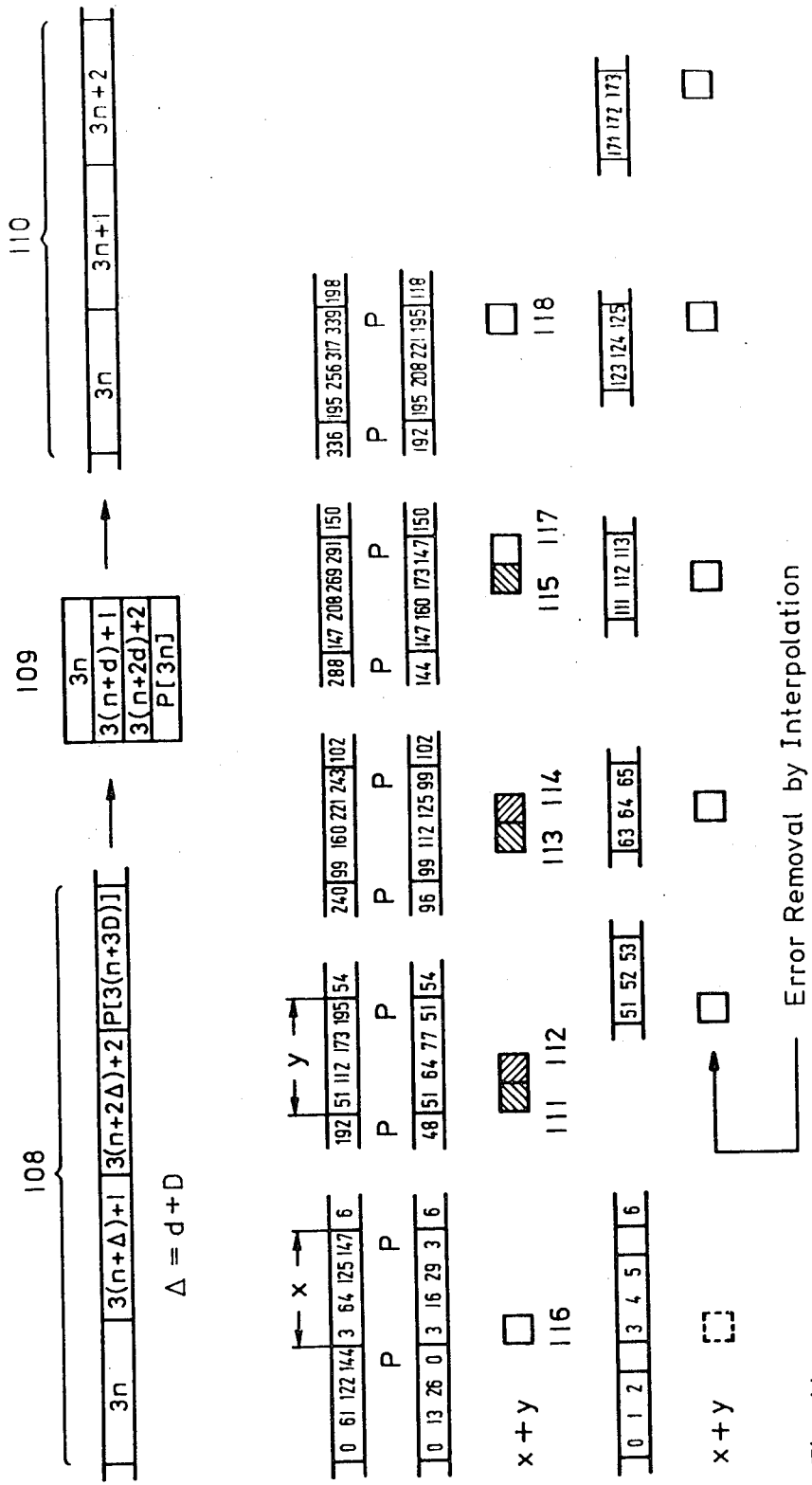
FIG. 14 is a diagram illustrating the effect of errors in a system according to the invention employing the devices shown in FIGS. 9 and 11.

FIG. 14 shows the treatment of errors in a device according to the invention composed of the circuits shown in FIGS. 9 and 11. The data block 108 in the first line shows the arrangement of the data words as they are transmitted over the channel, i.e., at the output of the circuit of FIG. 9. After the first de-interleaving in circuit 94, these data are freed of the parity word according to block 109. By evaluation of the parity word, single errors can be removed completely. After this correction, the data words then go to the further de-interleaving circuit 95 after which the final signal in the form of block 110 can be fed to the digital/analog converter. The second and third lines of FIG. 14 show the data pattern at the input and output, respectively, of the first de-interleaving circuit 94. In the second and third lines the fourth data word of each data block corresponds to the parity word. Two interfered-with data blocks X and Y are distributed, after the first de-interleaving, as shown in the fourth line of FIG. 14. The error location 116 can be completely corrected by evaluation of the parity word. Error locations 117 and 118 are merely interfered-with parity words. The remaining error locations 111 through 115 have been dispersed in such a manner, as shown in the fifth line of FIG. 14, that after the second de-interleaving operation in circuit 95, only a single data word remains interfered with, as indicated in the sixth line of FIG. 14. Thus subsequent interpolation can be performed with ease and good error removal can be realized.

In this way it is prevented that upon the occurrence of double errors which cannot be corrected by parity check, the conditions for interpolation are unfavorable at the same time. In one practical embodiment, the delay duration D corresponds to the duration of 16 data blocks and the delay duration d corresponds to the duration of four data blocks so that the total delay D+d corresponds to the duration of 20 data blocks.

In one embodiment of the invention the delay D of the first interleaving means and the corresponding de-interleaving means corresponds to delay d of the second interleaving means and the corresponding de-interleaving means so that the total difference $\Delta$ between the delays produced by successive delay paths are 2 D.

It will be understood that the above description of the present invention is susceptible to various modifications, changes and adaptations, and the same are intended to be comprehended within the meaning and range of equivalents of the appended claims.

What is claimed is:

1. In a system for processing pulse code modulation signals in the form of a succession of data words and transmitting such signals over a channel, which system includes an input portion having a parity circuit connected for receiving successive groups of the data words and for adding a parity word to each group of data words, and a first interleaving circuit connected for cyclically interleaving the successive groups of data words and their associated parity words and supplying the interleaved words to the input end of the channel, and an output portion having a first de-interleaving circuit connected for cyclically de-interleaving the words arriving at the output end of the channel so that the words, after de-interleaving in the first de-interleaving circuit, are present in the sequence existing before interleaving in the first interleaving circuit, and a parity check circuit connected for evaluating each parity word appearing at the output of said first de-interleaving circuit, and for conducting each data word appearing at the output of said first de-interleaving circuit, the improvement wherein said input portion further comprises a second interleaving circuit having an input connected for receiving the succession of data words and including interleaving means for cyclically interleaving the data words to form the successive groups of data words, said second interleaving circuit having an output connected to said parity circuit for supplying the successive groups of data words to said parity circuit, said output portion further comprises a second de-interleaving circuit connected to said parity check circuit to receive the data words conducted thereby and including de-interleaving means operating in a manner to complement said interleaving means of said second interleaving circuit, and an output connected to conduct the data words provided by said de-interleaving means, and said output portion further comprises interpolation means connected to the output of said second de-interleaving circuit.

2. System as defined in claim 1 wherein the pulse code modulation signals are audio signals and the channel includes a record disc or magnetic tape on which the interleaved pulse code modulation signals are stored.

3. System as defined in claim 1 wherein each said interleaving circuit comprises a plurality of delay paths each producing a delay of a respectively different duration, and switching means operative for connecting each delay path in succession, one at a time, in circuit between the system input and the channel.

4. System as defined in claim 3 wherein the differences between the delays produced by successive delay paths of said first interleaving circuit are identical to one another, and the differences between the delays produced by successive delay paths of said second interleaving circuit are identical to one another and are different from those of said first interleaving circuit.

5. System as defined in claim 4 wherein the differences between the delays produced by successive delay paths of said first interleaving circuit are each substantially equal to five times each of the differences between the delays produced by successive delay paths of said second interleaving circuit.

6. System as defined in claim 3 wherein the difference between the delays produced by successive delay paths of said first interleaving circuit are unequal to one another, and the differences between the delays produced by successive delay paths of said second interleaving circuit are unequal to one another and are different from those of said first interleaving means.

7. System as defined in claim 3 wherein said first interleaving circuit operates to group the interleaved data words into blocks at the input end of the channel, and each said de-interleaving circuit comprises a plurality of delay paths each producing a delay of a respectively different duration, and switching means for connecting each delay path in succession, one at a time, in circuit between the channel and the system output, with the differences between the delays produced by successive paths of said first interleaving circuit and of said first de-interleaving circuit being equal to the period of four blocks, and the differences between the delays produced by successive paths of said second interleaving circuit and of said second de-interleaving circuit being equal to the period of sixteen blocks.

8. System as defined in claim 1 wherein said parity circuit forms each parity word by performing modulo-2 addition of the corresponding data bits of the group of data words to which that parity word is added.

9. System as defined in claim 1 wherein each said de-interleaving circuit comprises a plurality of delay paths each producing a delay of a respectively different duration, and switching means operative for connecting each delay path in succession, one at a time, in circuit between the channel and the system output.

10. System as defined in claim 9 wherein the differences between the delays produced by successive delay paths of said first de-interleaving circuit are identical to one another, and the differences between the delays produced by said second de-interleaving circuit are identical to one another and are different from those of said first de-interleaving circuit.

11. System as defined in claim 10 wherein the differences between the delays produced by successive delay paths of said first de-interleaving circuit are each substantially equal to five times each of the differences between the delays produced by successive delay paths of said second de-interleaving circuit.

12. System as defined in claim 9 wherein the differences between the delays produced by successive delay paths of said first de-interleaving circuit are unequal to one another, and the differences between the delays produced by successive delay paths of said second de-interleaving circuit are unequal to one another and are different from those of said first de-interleaving circuit.

13. System as defined in claim 1 wherein said interleaving and de-interleaving circuits impart respectively different time delays to successive data words supplied thereto.

14. System as defined in claim 13 wherein said interleaving circuits operate to perform the successive interleaving operations in such a manner that the greatest possible total delay times result.

15. System as defined in claim 1 wherein said first interleaving circuit operates to group the interleaved data words and parity words into blocks at the input end of the channel.

16. System as defined in claim 15 wherein each said interleaving circuit performs each interleaving operation in successive cycles, with each cycle of the interleaving operation performed by said first interleaving circuit corresponding in duration to one data word block and each cycle of the interleaving operation performed by said second interleaving circuit having a different duration.

17. System as defined in claim 15 wherein each block is composed of three data words and one parity word.

18. System as defined in claim 17 wherein each data word consists of a representation of two or four sample values.

19. System as defined in claim 15 wherein said first interleaving circuit comprises means for adding a cyclic redundancy check word and a synchronizing word to each block supplied to the input end of the channel.

20. System as defined in claim 15 wherein said interleaving and de-interleaving circuits operate to subject each arriving data word to a total delay corresponding to the period of 20 blocks.

21. System as defined in claim 1 wherein said interleaving and de-interleaving circuits comprise a random access memory to establish different delay periods for each data word in each said circuit.

22. System as defined in claim 1 wherein said output portion further comprises a digital/analog converter connected between the output of said second de-interleaving circuit and said interpolation means.

* * * * *